(12) United States Patent
Darwish et al.

(10) Patent No.: US 10,069,669 B2
(45) Date of Patent: Sep. 4, 2018

(54) HIGH FREQUENCY MULTI-ANTENNA TRANSMITTER(S)

(71) Applicant: U.S. Army Research Laboratory ATTN: RDRL-LOC-I, Adelphi, MD (US)

(72) Inventors: Ali M Darwish, Laurel, MD (US); Hingloi Alfred Hung, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/422,219

(22) Filed: Feb. 1, 2017

(65) Prior Publication Data

US 2017/0171012 A1    Jun. 15, 2017

Related U.S. Application Data

(63) Continuation-in-part of application No. 14/969,665, filed on Dec. 15, 2015, now Pat. No. 9,584,169.

(51) Int. Cl.
*H04L 27/36* (2006.01)
*H04L 27/34* (2006.01)
*H04B 1/04* (2006.01)

(52) U.S. Cl.
CPC ....... *H04L 27/3405* (2013.01); *H04B 1/0483* (2013.01)

(58) Field of Classification Search
CPC . H04L 1/0003; H04L 1/0071; H04B 10/5053; H04B 7/084

USPC .................. 375/298, 295, 300; 455/101, 135
See application file for complete search history.

(56) References Cited

U.S. PATENT DOCUMENTS

| | | | |
|---|---|---|---|
| 4,084,471 A | 4/1978 | Franssen | |
| 5,939,916 A | 8/1999 | Jamal et al. | |
| 7,369,832 B2 | 5/2008 | Cho | |
| 2005/0062667 A1* | 3/2005 | Shirosaka | ................ H01Q 1/38 343/794 |
| 2006/0264183 A1 | 11/2006 | Chen et al. | |
| 2013/0279913 A1 | 10/2013 | Akiyama et al. | |

(Continued)

OTHER PUBLICATIONS

U.S. Appl. No. 14/969,665, filed Dec. 15, 2015 titled "High Frequency Transmitter."

(Continued)

*Primary Examiner* — Khai Tran
(74) *Attorney, Agent, or Firm* — Eric Brett Compton

(57) ABSTRACT

A radio transmitter having a RF signal source. A splitter receives an input signal from the signal source and divides that input signal into two output signals. Alternatively, two signal generators provide the two output signals. These output signals are fed into two phase shifters. A phase control signal is applied to each phase shifter so that the vector sum of the output signals represents the desired amplitude and phase of the desired transmitted signal. The outputs of both phase shifters are both frequency multiplied and amplified before recombining to form the transmitter output signal. Moreover, the outputs can be transmitted separately and combined at the receiver. Alternatively, in the case of two signal sources, the signal paths may be at different transmitter locations.

22 Claims, 5 Drawing Sheets

(56) References Cited

U.S. PATENT DOCUMENTS

2016/0049728 A1   2/2016   Ho et al.

OTHER PUBLICATIONS

Ali Darwish et al., "Efficient Linear Transmission of Complex Waveforms at 216 GHz Using Nonlinear Multiplier Chains," presented at the IEEE International Microwave Symposium (IMS) May 22-27, 2016, in San Francisco, CA.

* cited by examiner

HIGH FREQUENCY MULTI-ANTENNA TRANSMITTER(S)

CROSS REFERENCE TO RELATED APPLICATION(S)

This application is a continuation-in-part (CIP) of U.S. patent application Ser. No. 14/969,665 filed Dec. 15, 2015, herein incorporated by reference in its entirety.

GOVERNMENT INTEREST

The invention described herein may be manufactured, used, and licensed by or for the United States Government.

BACKGROUND OF THE INVENTION

I. Field of the Invention

The present invention relates generally to high frequency transmitters and, more particularly, to a method and apparatus for modulating the transmission signal utilizing phase shifters.

II. Description of Related Art

For electromagnetic radiation, the length of an antenna radiator is inversely proportional to the frequency of the electromagnetic transmission. Consequently, it is very difficult to transmit low frequency signals, such as voice or video, as electromagnetic waves at their original frequencies. In order to do so, would render the necessary antenna radiators unacceptably long.

Consequently, in communication radio, a low frequency signal, also known as a baseband signal, is typically upconverted in frequency to the carrier frequency. For example, in AM radio voice signals having a bandwidth of about 5 kilohertz are typically upconverted to 531-1611 kilohertz for commercial medium wave AM radio, or to 2.5-26.1 megahertz for shortwave AM radio. By upconverting the low frequency of the voice signal, transmission of the radio signal can be accomplished with a practical sized antenna.

The process of upconversion is done through the use of a mixer which mixes a desired baseband signal, known as the IF or intermediate frequency signal, with a high frequency signal known as the LO (local oscillator) signal. The mixer, however, does not simply add the LO and IF signals together. Instead, the output from the mixer contains both the sum and the difference of the LO and IF frequencies, as well as the LO signal. For example, assuming an LO signal of 10 megahertz and an IF signal of 5 kilohertz, the output from the mixer would contain not only the LO signal of 10 megahertz, but also two sideband signals that are modulated by the IF frequency. These signals would be centered at 9.995 megahertz and at 10.005 megahertz.

Although it is possible to amplify both the LO signal and both sideband signals for transmission from the appropriate antenna, to do so is very power inefficient. This power inefficiency arises since each sideband signal contains the same modulation information and the LO signal contains no useful information at all. Consequently, in order to increase the power efficiency of the transmitter, it is necessary to remove one of the sideband signals as well as the LO signal prior to amplification and transmission. However, this requires very narrow band filters to filter out the undesired signal. The remaining signal is then amplified and transmitted. Such filters, however, add distortion to the output signal.

While the previously known practice of using upconversion optionally followed by filtering of the upconverted signal has proven effective for relatively low frequency radio transmitters, i.e. radio transmitters transmitting at a frequency of less than 10 gigahertz, such radio communications transmitters have proven impractical for high frequency radio transmitters, i.e. radio transmitters in the range of 0.1 to 10 terahertz, for a number of different reasons.

First, solid-state frequency sources at such high frequencies, i.e. greater than 100 gigahertz, are necessarily low powered, typically generating 1 watt or less in power. Furthermore, for low distortion, the LO signal power must be at least 10 times the power of the IF signal desired to be upconverted and ultimately transmitted. Consequently, with an LO signal source having a 1 watt output and used as a carrier wave input to the radio mixer, the input from the RF signal to be modulated cannot be greater than 0.1 watt. Otherwise, excessive distortion of the modulated sideband signal would occur.

In order to improve the overall power efficiency of the transmitter, the carrier signal and one sideband should be removed from the output signal from the RF mixer. However, to do so requires a very narrow band filter. Such narrow band filters, particularly at high frequencies, are not only lossy but do not provide flat group delay. Such narrow band filters also distort the signal and this distortion becomes worse as the filter bandwidth becomes narrower. All these factors thus result in distortion of the signal desired for transmission as well as a very low output power for the modulated signal. This, in turn, requires excessive amplification in order to reach an acceptable power level, e.g. a few watts, for practical applications.

For all the foregoing reasons, the use of RF mixers which mix IF sources with the LO mixer input, even when followed by frequency multipliers which also add distortion, results in excessive distortion and power loss for the RF signal.

SUMMARY OF THE PRESENT INVENTION

The present invention provides a high frequency transmitter that overcomes most of the above-mentioned disadvantages of the previously known transmitters.

In brief, in the radio transmitter of the present invention, a radio frequency signal source, named RF in, e.g. 10 gigahertz at 21 watts, is first connected as an input signal to a power splitter. The power splitter divides the source signal into two in-phase 10 gigahertz signals which are almost equal. The power splitter necessarily introduces a small loss into the signal so that, assuming the source signal has a power of 21 watts, the power outputs from the power splitter may be about 10 watts each; and will be referred to as RF_in1 and RF_in2.

The two outputs from the power splitter, RF_in1 and RF_in2, are inserted as input signals to two phase shifters. Each phase shifter has two inputs and one output. The two inputs are a high frequency signal (e.g. RF_in1) and a lower frequency baseband phase-control signal. The phase shifter output is a high frequency signal which is phase-shifted. The phase-control signals are selected such that the vector-sum of the two output signals has the desired amplitude and phase-shift.

Unlike mixers, phase shifters introduce little power degradation or distortion into the signal. Consequently, the output from each phase shifter having a 10 watt input would be 90% of the power of the input signal or about 9 watts.

The outputs from the phase shifters are then frequency multiplied to the desired transmission frequency, i.e. at high frequency between 0.1 and 10 terahertz, and each of those signals is then amplified. The amplified signals are then combined together by a power combiner to produce the output signal for the transmitter.

In some embodiments, a radio transmitter comprises two signal paths; a pair of phase shifters, one phase shifter provided in one of said two signal paths and the other phase shifter in the other of said two signal paths, each phase shifter receiving a phase control signal representative of different components of a modulation signal which shifts the phases of the outputs signals in the two signal paths, respectively; and a pair of antennas, one for each of the two signal paths, which are configured to transmit the output of that signal path, wherein said phase control signals are selected so that a vector-sum of the output signals in the two signal paths, when combined, represents a desired amplitude and a desired phase shift of the combined signal.

The transmitter may include a radio frequency signal source; and a splitter which receives an input signal from said signal source and divides said input signal into two input signals one for each of the two signal paths. In this configuration, the antennas may be located at the same location as the transmitter. In others, the transmitter may include a pair of radio frequency signal sources, each of the pair of signal sources providing an input signal to a respective one of the two signal paths. This permits the antennas to be located at different locations.

In another embodiment, a radio transmitter comprises: a radio frequency signal source; a splitter which receives an input signal from said signal source and divides said input signal into two output signals along two signal paths; a pair of phase shifters, one phase shifter provided in one of said two signal paths which receives one of said output signals from said splitter and the other phase shifter in the other of said two signal paths which receives the other of said output signals from said splitter, each phase shifter receiving a phase control signal representative of different components of a modulation signal which shifts the phases of the outputs signals, respectively; and wherein said phase control signals are selected so that a vector-sum of the output signals in the two signal paths, when combined, represents a desired amplitude and a desired phase shift of the combined signal.

In yet another embodiment, a radio transmitter system comprises: first and second transmitters provided in two signal paths, each transmitter comprising: a radio frequency signal source; a phase shifter which receives an input signal from said signal source and a phase control signal representative of different components of a modulation signal which shifts the phase of the output signal for that transmitter; and wherein said phase control signals are selected so that a vector-sum of the output signals in the two signal paths, when combined, represents a desired amplitude and a desired phase shift of the combined signal.

In further embodiments, a system comprises a radio transmitter as set forth herein and a receiver. In one configuration, the receiver comprises a single antenna which receives the output signals transmitted from the radio transmitter and forms the combined signal. In another configuration, the receiver comprises: a pair of two antennas which receive the output signals from the radio transmitter; and a signal combiner which combines the output signals received and forms the combined signal.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF THE PRESENT INVENTION

Figure 1:
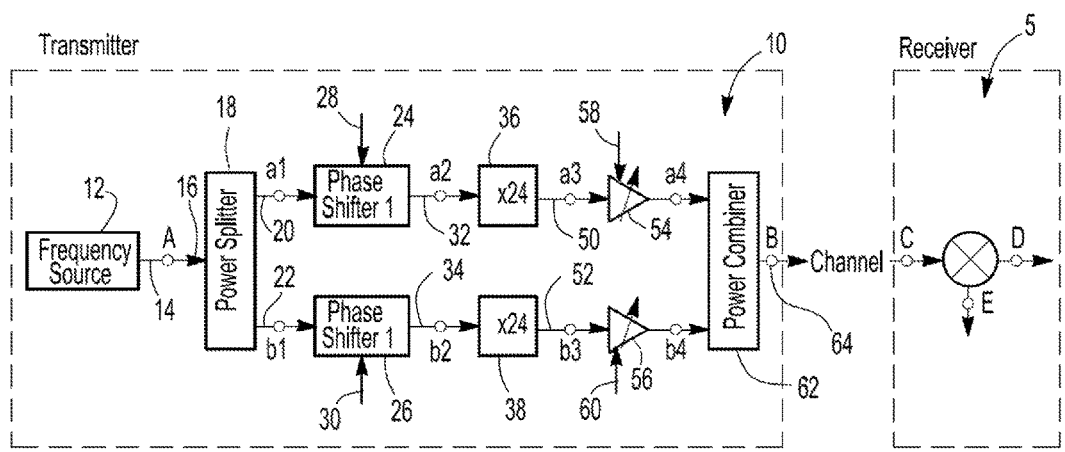
FIG. 1 is a block diagrammatic view illustrating a first embodiment of the present invention where FIG. 1A further shows a controller which may be used with FIG. 1.

With reference first to FIG. 1, a block diagrammatic view illustrating a first embodiment radio frequency transmitter 10 is shown. The transmitter 10 is used in conjunction with a receiver 5 also illustrated in FIG. 1. The receiver 5 may be any conventional RF receiving device.

The transmitted 10 may be configured as high frequency transmitter in some embodiments. As used herein, the term "high frequency transmitter" shall mean a radio frequency transmitter transmitting at a frequency range in excess of 10 gigahertz and typically in the range of 0.1 terahertz to 10 terahertz. The use of high frequency provides many benefits over lower frequency communications. First, due to high frequency, the transmitted signal propagates in laser-like beams. Hence, communications can be very secure. Additionally, the high frequency opens the door to very broadband (e.g., tens of gigabits per second) communications. Also, a number of chemical and bio agents have resonances at high frequency. Being able to construct complex waveforms at high frequency will aid in the detection and sensing of such agents.

The transmitter 10 includes an RF signal source 12 which produces a signal on its output 14 at point A at a fixed frequency, e.g. 10 gigahertz. Ten gigahertz signal sources are currently commercially available with an output power greater than 20 watts.

The output 14 from the signal source 12 is inserted into an input 16 of a power splitter 18. In the art, a power splitter may also be commonly referred to as a signal divider. The power splitter 18 divides the signal from the signal source 12 received at its input 16 into two essentially equal outputs 20 and 22. Such power splitters for 10 gigahertz signals are commercially available with little insertion loss. For example, assuming that the power output from the signal source 12 is 21 watts, the power splitter will only degrade that signal by about 1 watt, thus producing two 10 watt and 10 gigahertz signals on the outputs 20 and 22. Furthermore, these signals are in-phase with each other.

The first output 20 from the power splitter 18 is coupled as an input signal to a first phase shifter 24. Similarly, the output 22 from the power splitter 18 is coupled as an input signal to a second phase shifter 26. The phase shifters 24 and 26 each receive a phase control signal 28 and 30, respectively, which modulate the phase at the outputs 32 and 34 of the phase shifters 24 and 26.

The phase control signals to the phase shifters on control inputs 28 and 30 represent two different components of an overall modulation signal.

Consequently, the modulation or phase control signal on input line 28 to the first phase shifter correlates with the first phase shift $\phi_1$ of vector 42 while, similarly, phase control signal on input line 30 to the second phase shifter correlates with the second phase shift $\phi_2$ of vector 44.

A primary advantage of utilizing phase shifters 24 and 26 to effectively modulate the signal is that such phase shifters create very little degradation of the signals as compared to the previously used RF mixers. For example, in a typical phase shifter 24 and 26 at a frequency of 10 gigahertz, only about 10% power loss would occur as the signal passes through the phase shifters 24 and 26.

Referring again to FIG. 1, the signal on the outputs 32 and 34 of the phase shifters 24 and 26 are respectively inserted as input signals into frequency multipliers 36 and 38. The frequency multipliers 36 and 38 multiply the frequency of the source 12 to a high frequency range, i.e. in excess of 100 gigahertz. The frequency multiplication of 24 shown in the drawing is by way of example only. For instance, in FIG. 1, the phase shifters 28, and 30 were introduced after the power splitter 18, and before the ×24 frequency multipliers 36, 38. However, the order of phase shifting and frequency multiplication can be changed. For example, one may perform the ×24 frequency multiplication and then the phase shifting. Additionally, one may perform part ×2 frequency multiplication, carry out the phase shifting, and then perform ×12 frequency multiplication such that the total multiplication is the same, ×24. The point is that the phase shifting can be carried out before the frequency multiplication, during the frequency multiplication, or after the frequency multiplication. The key aspect is that the vector sum of the two (or more branches) branches adds up to the desired signal at point B to be transmitted.

Power is then boosted by a pair of power amplifiers 54 and 56 which are then combined by a power combiner 62 to provide the high frequency modulated signal at an output signal 64 from the power combiner 62. The power amplifiers 54, 56 may be optional in some embodiments. Each amplifier receives a gain control signal 58 and 60, respectively, which controls the gains at the outputs of the amplifiers 54, 56.

In some implementations, the output signals of the amplifiers 54, 56 may be amplitude controlled by using a variable amplifier (as shown in FIG. 1) or an attenuator (not shown in FIG. 1) in order to ensure that they have essentially equal amplitude at the input of the power combiner 62 if desired. In FIG. 1, the ×24 frequency multiplication is followed by an optional amplifiers 54, 56. The amplifiers variable gain amplifiers (as shown). Fixed gain amplifiers could be used with or without attenuator elements to provide any desirable gain for the signals. However, it should be apparent that one may do partial multiplication followed by amplification (or vice versa). For example, instead of the ×24 frequency multiplication in FIG. 1, we may perform ×2 frequency multiplication, say, amplify the signal (using an amplifier), and then perform ×12 frequency multiplication followed by more amplification. We can also do perform ×3 frequency multiplication, say, amplify the signal (using an amplifier), and then perform ×8 frequency multiplication.

The two phase modulated signals a4 and b4 are combined by the power combiner 62 to form output signal 64 prior to transmission by the transmitter 10. The output signal 64 is broadcast by antenna means (not shown) and passes through a channel (which could be air or other medium) before being received by the receiver 5. FIG. 1 shows a simple receiver where the received signal at 240 GHz, in this case, (at point C) is mixed using a passive (or active mixer) with a 238 GHz, say, local oscillator signal (at point E) to produce a 2 GHz (the difference between the received signal frequency and the local oscillator frequency) as the intermediate frequency (at point D). However, many other types of receiver architectures are available (such as zero intermediate frequency receiver) and may be used as alternate receivers.

Figure 1A:
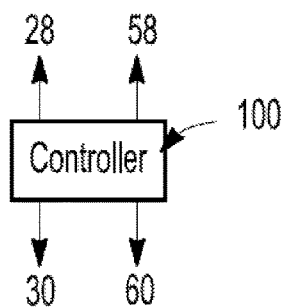

FIG. 1A shows an exemplary controller 100 for generating phase control signals 28 and 30, and the gain control signals 58 and 60. The controller 100 receives a desired vector S for the output signal. For instance, the desired vector S may be provided by a user, retrieved as a default value stored in memory, and/or determined from a look-up table of known values stored in memory associated with the controller, for instance.

Analog output signals can correspond to any arbitrary amplitude or gain as would be suitable for such communications. For digital communications, the output signals a4, b4 may correspond to predetermined symbols (or points) which correspond to know values. These may be QAM symbols. In one embodiment, the look-up table may provide amplitude and phase values for all 16 QAM symbols (or other digital schemed). For some RF applications, such as FM (frequency modulation) the amplitude |S| might not be significant. Likewise, for some applications, such as AM (amplitude modulation), the phase $\Phi_S$ might not be significant.

In general, any suitable electronic processor (or microprocessor) can be configured and used for calculating vectors v1 and v2 according to the methodologies discussed below for controller 100. The phase control signals 28 and 30 correspond to $\phi_1$, and $\phi_2$, respectively. And the gain control signals 58 and 60 correspond to |v1| and |v2|, respectively. The controller 100 can be physically located in the transmitter 10 or provided remote thereto.

The digital modulation signals employed by embodiments of the present invention may be based on a Quadrature Amplitude Modulation (QAM) schemes. While a 16 QAM scheme is primarily discussed herein, it will be appreciated that other QAM schemes may also be used (e.g., 64-QAM and 256-QAM). For example and with reference to FIGS. 2A and 2B, assume the data of interest to be transmitted is a digital signal made of up a series of 16 QAM data symbols or points 40 arranged on an IQ phase constellation plane. A digital value from 0 hexadecimal—F hexadecimal is assigned to each of the data points 40. The data points 40 are, in addition, symmetrically arranged on the IQ plane and the digital value of each point 40 is predetermined.

In the 16 QAM digital modulation scheme, the signal may assume only one of 16 possible states. Each state is represented by one of the data points 40, each having a unique Q-component and a unique I-component. Q and I are modulating signals. Any of the 16 data points 40, called a symbol and denoted by S, with amplitude|S|, and phase $\Phi$s, may be identified as the sum of two equal-amplitude vectors 42 and 44 having phases $\phi_1$ and $\phi_2$ corresponding to the angles of the vectors 42 and 44, respectively.

In FIG. 1, the power splitter 18 divides the power equally into two signals a1, and b1. After traveling through the various elements—i.e., the phase shifters 28, and 30, the multipliers 36, and 38, the amplifiers 54, and 56—signal a1 ultimately becomes a4, and signal b1 ultimately becomes b4.

If we assume that signal a4 corresponds to a first vector v1 then $v1=|v1|\angle\phi_1$ where |v1| is the amplitude of signal a4, and $\phi_1$ is the phase of signal a4. Similarly assuming signal b4 corresponds to a second vector v2 then $v2=|v2|\angle\phi_2$ where |v2| is the amplitude of signal b4, and $\phi_2$ is the phase of signal b4.

The phase of v1, $\phi_1$, will be determined by phase shifter 28, and the phase of b4, $\phi_2$, will be set by phase shifter 30. When signals a4, and b4, are combined using power combiner 58, the resulting signal S, at point B, will be equal $|v1|\angle\phi_1+|v2|\angle\phi_2$. This assumes the ideal case in which negligible losses occur in the combining process. The maximum amplitude for S that can be obtained when $\phi_1=\phi_2$ and is equal to $(|v1|+|v2|)$. The minimum amplitude for S that can be obtained when $\phi_1=\phi_2+180°$ and is equal to $\||v1|-|v2|\|$.

For simplicity, we will first assume that $|v1|=|v2|$. In this case, the maximum amplitude for S will be $2|v1|$ and the minimum amplitude for S will be zero (which gives us a lot of flexibility). And the process for determining $|v1|$, $\phi_1$, and $\phi_2$, is as follows:

Suppose we would like to transmit a signal S with amplitude $|S|$ and phase $\Phi_S$ and suppose that the maximum amplitude for vector v1 (or v2) is $|v1|_{max}$ and the maximum amplitude of S is $|S|_{max}$. If $|S|_{max}>2|v1|_{max}$, then it is not likely possible achieve a signal with this amplitude. If $|S|_{max}\leq 2|v1|_{max}$, then $|v1|$, $\phi_1$ and $\phi_2$ are calculated as follows:

$$|S|_{max}=\sqrt{I^2+Q^2}$$

$$\Phi_S=\tan^{-1}(Q/I)$$

$$|v1|=|v2|=|S|_{max}/2$$

$$\phi_1=\Phi_S-d\Phi,$$

$$\phi_2=\Phi_S+d\Phi$$

where $d\Phi=\cos^{-1}(|S|/|S|_{max})$.

If $|S|$ is assumed to be equal to $|S|_{max}$, then $d\Phi=\cos^{-1}(1)=0°$

The phases $\phi_1$ and $\phi_2$ may be set to the above values using phase shifters 24, and 26, respectively, according to phase control signals 28 and 30. The amplitudes $|v1|$ and $|v2|$ are determined by the choice of gain components (e.g., amplifier, and attenuator).

Figure 2A:
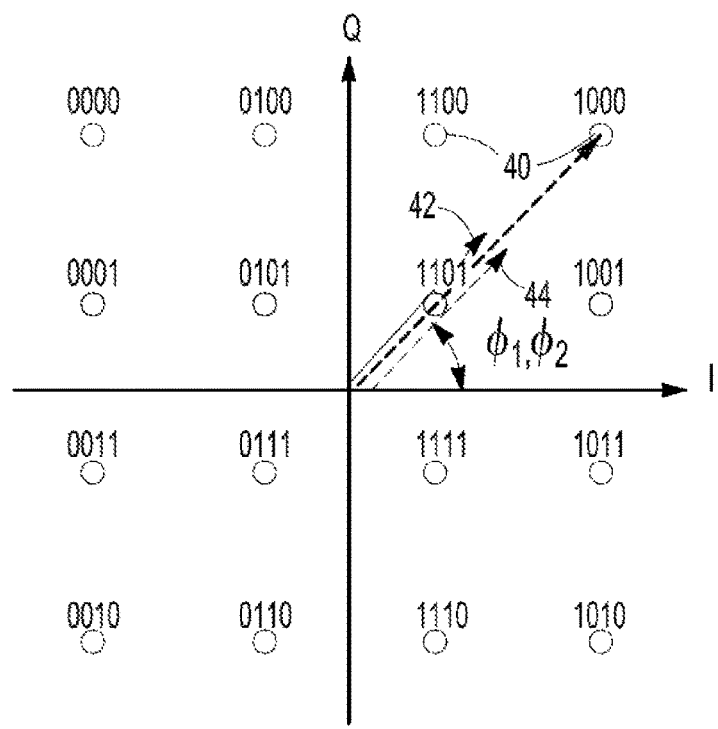
FIGS. 2A and 2B show phase and amplitude diagrams for exemplary control signals according to embodiments of the present invention.

Example 1 (FIG. 2A)

Suppose we would like to transmit symbol a 16QAM signal and suppose the maximum I amplitude, and Q amplitude is 3. The maximum amplitude for 16QAM signals occurs at symbols 0000, 1000, 0010, and 1010, see FIG. 2A. Then, for symbol 1000 which is defined as I=3, and Q=3, we have, $$|S|_{max}=\sqrt{I^2+Q^2}=\sqrt{3^2+3^2}=3\sqrt{2}=4.24.$$

$$\Phi_S=\tan^{-1}((Q/I)=\tan^{-1}(3/3)=45°$$

$$S=4.24\angle 45°$$

$$|v1|=|S|_{max}/2=4.24/2=2.12$$

$$|v2|=|v1|=2.12$$

$$d\Phi=\cos^{-1}(|S|/|S|_{max})=\cos^{-1}(4.24/4.24)=0°$$

$$\phi_1=\Phi_S-d\Phi=45°-0°=45°$$

$$\phi_2=\Phi_S+d\Phi=45°+0°=45°$$

Figure 2B:
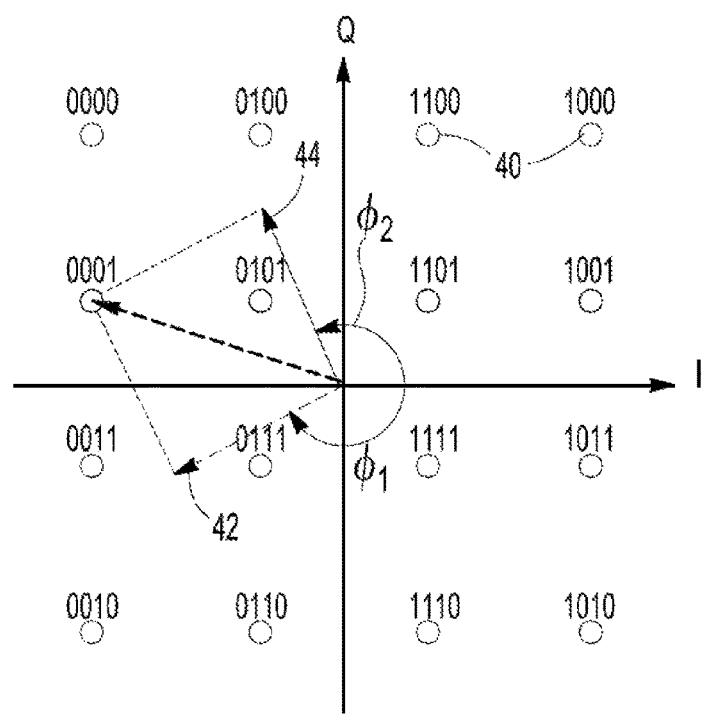

Example 2 (FIG. 2B)

Suppose that we want to transmit symbol 0001, which is defined as I=−3 and Q=1. This is shown in FIG. 2B. Then, we have, $$|S|=\sqrt{I^2+Q^2}=\sqrt{(-3)^2+1^2}=\sqrt{10}=3.16$$

$$\Phi_S=\tan^{-1}(Q/I)=\tan^{-1}(1/-3)=161.57°$$

$$S=3.16\angle 161.57°$$

$$|v1|=|S|_{max}/2=4.24/2=2.12$$

$$|v2|=|v1|=2.12$$

$$\phi_1=\Phi_S-d\Phi=161.57°-41.82°=119.75°$$

$$\phi_2=\Phi_S+d\Phi 161.50°+41.82°=203.39° \text{ (or }-156.6°\text{, as shown)}$$

For the case where the vectors and a4 and b4 have unequal amplitudes ($|v1|\neq|v2|$), we can still add them to construct a transmit vector S with amplitude $|S|$ and phase $\Phi_S$ by observing that:

$$S=|S|\angle\Phi_S=S_x x+S_y y=|S|(\cos(\Phi_S)x+\sin(\Phi_S)y)$$

$$v1=|v1|\angle\phi_1=v1_x x+v1_y y=|v1|(\cos(\phi_1)x+\sin(\phi_1)y)$$

$$v2=|v2|\angle\phi_2=v2_x x+v2_y y=|v2|(\cos(\phi_2)x+\sin(\phi_2)y)$$

where the vectors have been decomposed into their x, and y components.

Given that $S=|S|\angle\Phi_S=|v1|\angle\phi_1+|v2|\angle\phi_2$

Then the following pair of equations can be solved for the two unknowns $\phi_1$, and $\phi_2$ $$S_x=|v1|\cos(\phi_1)+|v2|\cos(\phi_2)$$

$$S_y=|v1|\sin(\phi_1)+|v2|\sin(\phi_2)$$

The case of $|v1|\neq|v2|$, relaxes the condition of adjusting the amplifier gain (or attenuator loss) in each signal path in order to insure equal $|v1|$, and $|v2|$. Of course, the drawback is that the minimum $|S|$ signal amplitude ($=\||v1|-|v2|\|$) is not equal to zero; some analog and digital modulations require the minimum signal amplitude to be zero.

It should be noted that under this condition ($|v1|\neq|v2|$), the maximum possible value for $|S|=|v1|+|v2|$. The minimum amplitude for S that is $|S|=\||v1|-|v2|\|$).

In the above examples and discussion, two vectors, v1 and v2 for the two output signals a4, and b4, were added to form a signal, S. However, it should be appreciated that one can add three or more vectors in a similarly manner such that a desired signal S is formed by the summed vectors at the output of the transmitter. Having three vectors, say, instead of two gives us greater degrees of freedom and flexibility. For example, we can have two vectors, v1 and v2, as the main vectors forming the desired signal S, while having a third vector v3 as an distortion correction vector to modify S slightly and bring it closer to the perfect magnitude and phase.

Assuming that the preferred transmission frequency is 240 GHz and the starting frequency is 10 GHz, a ×24 frequency multiplication would be used. However, it should be appreciated that if the starting frequency is 240 GHz because there is no need for frequency multiplication. In this case, the transmitter 10 could be composed of only a pair of phase shifters positioned between the power splitter 18 and the power combiner 62.

If the starting frequency was 480 GHz, then a ×2 frequency divider can be used to reach 240 GHz. Additionally, if the starting frequency was 120 GHz, then a factor of ×2 multiplication would have been used. Furthermore, any modulation type, other than 16QAM, can be used because the method presented allows for construction of any amplitude and phase.

Figure 3:
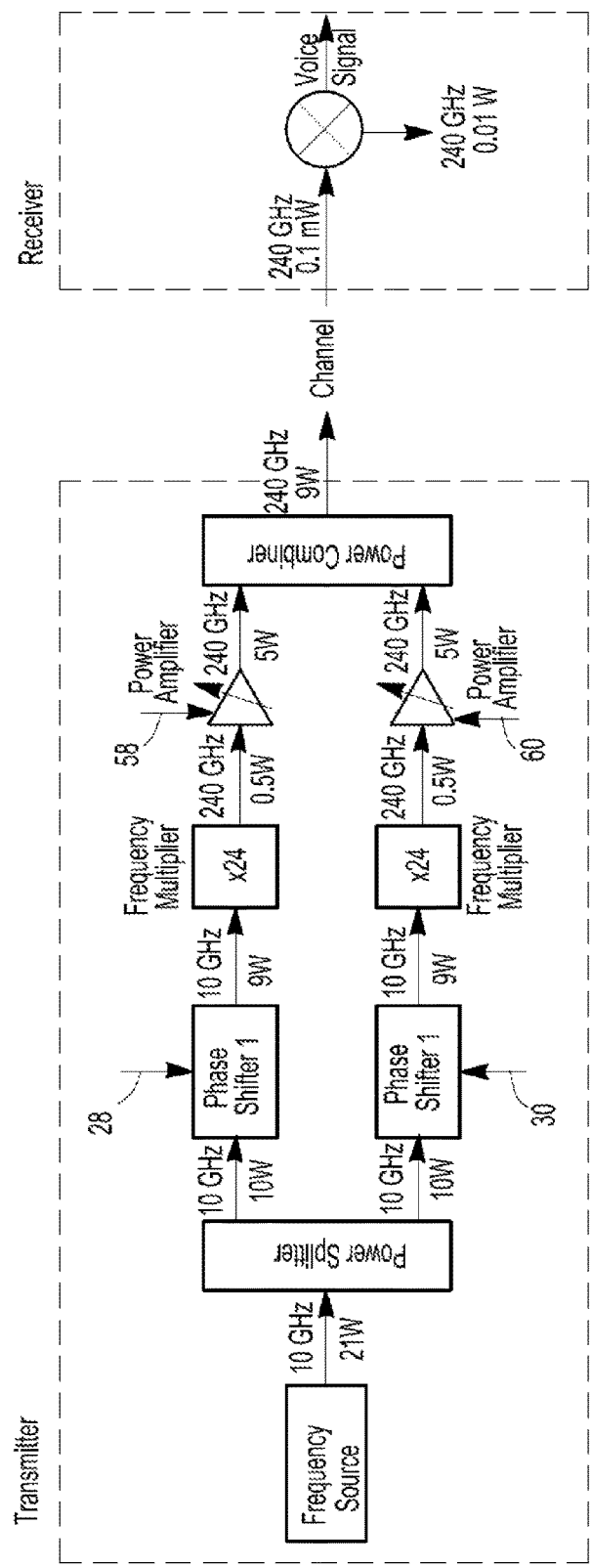
FIG. 3 shows an example of frequencies and power levels at various points along the transmitter and receiver according to one embodiment.

FIG. 3 shows an example of power levels and frequencies that may be present in FIG. 1. Here, the starting signal is 10 GHz at 21 Watts at the power splitter, which can be split to about 10 Watts in each path. Due to losses in the power splitter, the signal in each path that passes through a phase shifter might having about 10% loss. Hence, at the output of the phase shifters may only be about 9 Watts. After that, the signal is sent to a ×24 frequency multiplier and it emerges as ½ Watt. The ×24 frequency multiplier can be composed of cascaded frequency multipliers; for example, it can be composed of a cascade of four frequency multipliers having multiplication factors ×2, ×2, ×3, and ×2. The signal at the output of the ×24 frequency multiplier may be too small and require amplification by ×10 amplifier, say, to boost its power to 5 Watts before combining. At the output of the power combiner we may get 9 Watts, due to losses in the power combiner. The signal is then transmitted through the air, or another medium, and it suffers significant losses (due to atmospheric absorption, for example). The received signal is typically a small fraction of the transmitted power. At the receiver input, the receive signal may only be 0.1 Watt or less.

The interest in 240 GHz frequency stems from the fact that the atmospheric attenuation at this range is lower than surrounding frequencies. Frequency multipliers, significantly degrade the power of the signal at the outputs 50 and 52 of the frequency multipliers 36 and 38, respectively. However, even with a 95% signal power degradation, the power of the output signal from the frequency multipliers 36 and 38 will still equal about a half a watt for the example shown.

As can be seen from the foregoing, the first embodiment provides a high frequency transmitter which is able to transmit at relatively high power. Furthermore, since the modulation of the signal by the phase shifters 24 and 26 creates little degradation in the power of the signal, a relatively high power output signal at the output for the transmitter may be obtained. Furthermore, the amplitude at the input of the phase shifters, frequency multipliers, and power amplifiers are all substantially constant and frequency multipliers and power amplifiers may be operated in highly saturated mode to obtain maximum output power. The saturated mode is highly efficient and also highly nonlinear. However, since the amplitude is essentially constant at the input of the amplifier and the frequency multiplier, there will be no nonlinear distortions, unlike the previously known RF mixers. The amplitude variation of the signal happens only once the vector sum is generated at the output power combiner, or at the receiver (in the case where the two signals are radiated directly).

Similarly, since it is unnecessary to remove unwanted sideband signals and carrier signals by narrow filters, the present invention further eliminates most of the nonlinear distortions introduced by such narrow band filters.

In the paper titled "Efficient Linear Transmission of Complex Waveforms at 216 GHz Using Nonlinear Multiplier Chains," presented at the IEEE International Microwave Symposium (IMS) 22-27 May 2016, in San Francisco, Calif., an embodiment of invention operating at 216 GHz was shown with experimental measurements presented. That paper is herein incorporated by reference in its entirety. These results showed—for this high frequency—the output signal could be transmitted with significant power, i.e., without attenuation from the mixer's convergence efficiency. This is a significant advantage since generating high power at frequencies above about 200 GHz is difficult. Accordingly, the output signals in the two signal paths have a frequency of approximately 200 GHz or above.

Our technique offers much higher output signal power compared to other techniques especially at high millimeter wave and submillimeter frequencies, since other techniques have to back off their output power amplifier to achieve the linearity requirement needed for communication/data link. Of course, the frequency could be lower.

Figure 4:
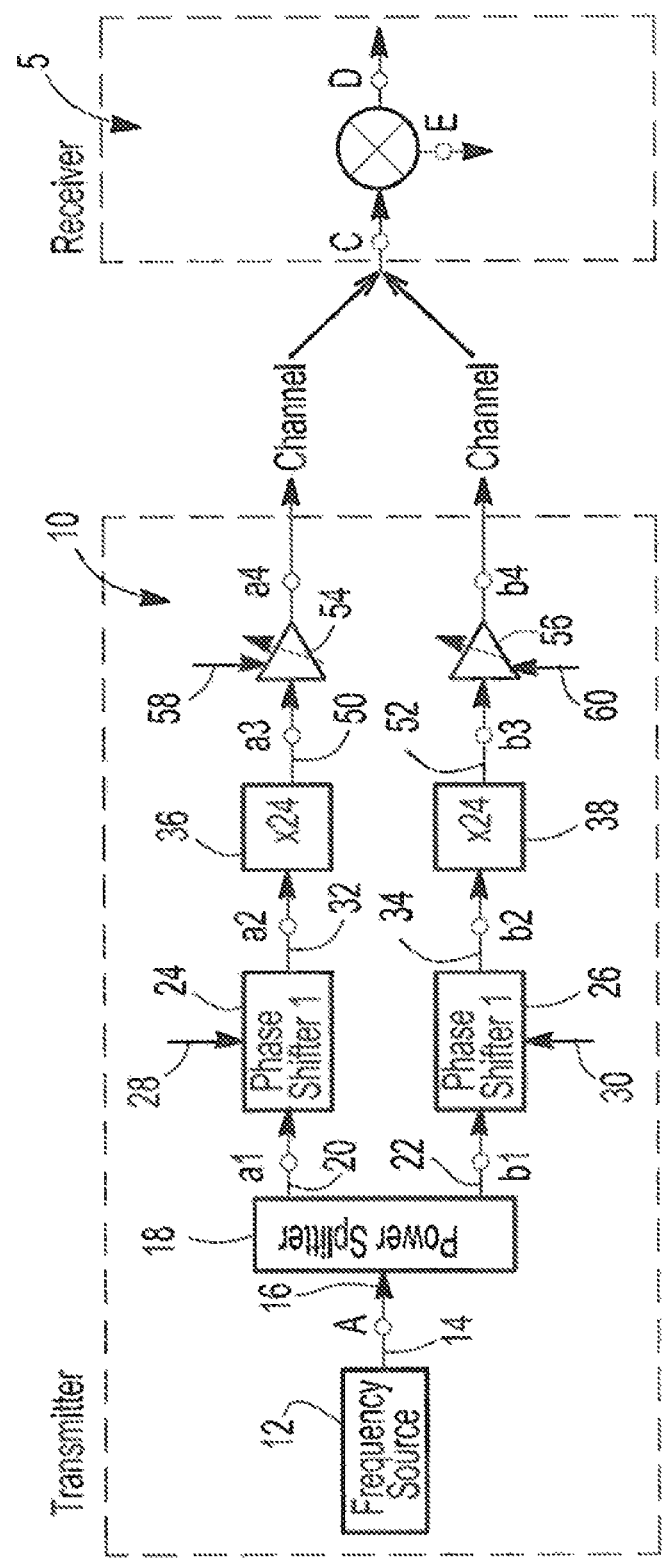
FIG. 4 is a block diagrammatic view illustrating a second embodiment of the present invention.

FIG. 4 illustrates a second embodiment of the invention where the two phase modulated signals a4 and b4 are not combined in the transmitter. Instead, both are radiated by co-located antennas (not shown) and pass through a channel (which could be air or other medium) before being received. The two signals may be received by a single antenna (not shown) at the receiver; in which case the signals combine by superposition at the receiving antenna. Combining the signals does not require a special circuit. When an antenna receives multiple signals, they naturally combine (due to electric field superposition). The received signal is similar to the combined signal from the first embodiment. Alternatively, the two signals may be received using two (or more) separate antennas (not shown) at the receiver, and combined with a combiner inside the receiver to form the combined signal.

The second embodiment introduces new challenges and opportunities compared to the first embodiment. One of the challenges stems from the fact that both signals are radiated and travel through the channel independently. This introduces the possibility that each signal may experience a different attenuation and/or phase shift from the other as it travels through the channel. To overcome the amplitude (and phase) variation due to the differing channel effect on each signal, the transmitter and receiver will need frequent calibration such that the transmitter can adjust its phase and amplitude to counteract the effect of the channel. One of the opportunities introduced the second embodiment is that the transmitted power is higher because the combiner losses have been eliminated.

Figure 5:
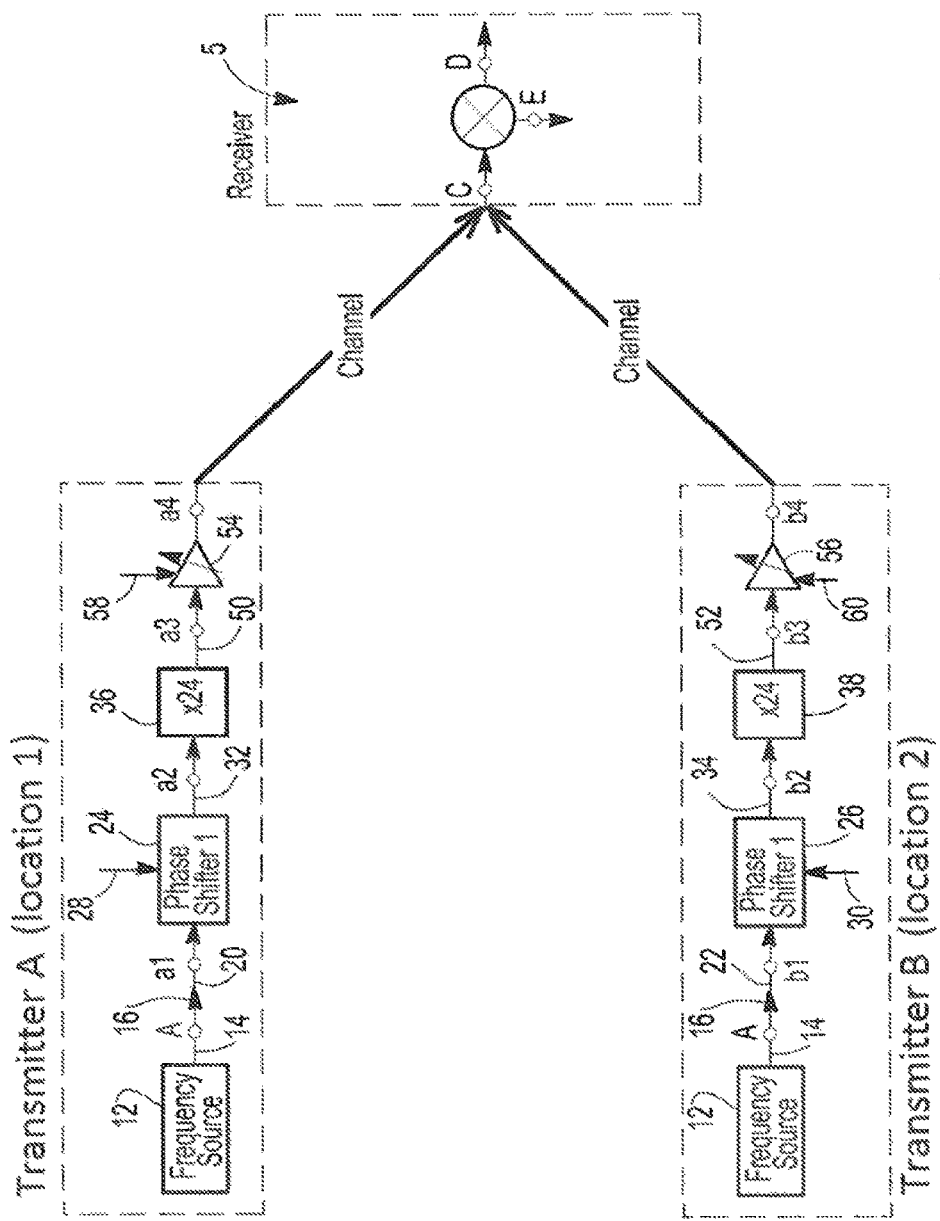
FIG. 5 is a block diagrammatic view illustrating a third embodiment of the present invention.

FIG. 5 illustrates a third embodiment of the invention where the two phase modulated signals a4 and b4 are separated into transmitters A and B, respectively; they each have separate frequency sources and the power splitter has been eliminated. As such, they do not need to be at the same location. Having both signals at separate locations gives greater flexibility. Both signals, a4 and b4, are radiated by antennas (not shown) and pass through a channel (which could be air or other medium) before being received. The two signals may be received by one antenna (not shown) at the receiver; in which case the signals combine by superposition at the receiving antenna. Alternatively, the two signals may be received using two separate antennas (not shown) at the receiver, and combined with a combiner inside the receiver to form the combined signal. Having two antennas at the receiver may give greater flexibility and improve performance. For example, if the two signals are coming from different directions, each receiver antenna can be pointed towards the signal source it is aiming to receive.

In, the third embodiment, similar to the second embodiment, the difference in amplitude and phase between the two signals (due to the different channel propagation effects from the different antenna locations) needs to be corrected by calibrating the transmitter and receiver to correct for phase and amplitude variations. Calibration will be needed to synchronize the two signals such that they arrive at the receiver simultaneously.

In the third embodiment, we can use highly directional antennas to transmit the signals. The highly directional antennas send narrow, laser-like beams towards the receiver. In this case, the signals intersect only at the receiver location and nowhere else. This makes eavesdropping much more difficult, since the message (which forms only when the two signals intersect) will be available at one location only (where the desired receiver is located). The ability to transmit high power signal with high spectral efficiency remains.

From the foregoing, it can be seen that the present invention provides a unique and effective high frequency transmitter capable of accurately and linearly modulating the output signal. Having described our invention, however, many modifications thereto will become apparent to those skilled in the art to which it pertains without deviation from the spirit of the invention as defined by the scope of the appended claims.

We claim:

1. A radio transmitter comprising:
   two signal paths;
   a pair of phase shifters, one phase shifter provided in one of said two signal paths and the other phase shifter in the other of said two signal paths, each phase shifter receiving a phase control signal representative of different components of a modulation signal which shifts the phases of the outputs signals in the two signal paths, respectively; and
   a pair of antennas, one for each of the two signal paths, which are configured to transmit the output of that signal path,
   wherein said phase control signals are selected so that a vector-sum of the output signals in the two signal paths, when combined, represents a desired amplitude and a desired phase shift of the combined signal.

2. The transmitter as defined in claim 1, further comprising:
   one or more pairs of frequency multipliers with one of each of the pair or pairs provided in each of the two signal paths,
   each frequency multiplier having an output, wherein said frequency multiplier outputs change the frequency of the output signals in the two signal paths.

3. The transmitter as defined in claim 2, wherein,
   an output from one phase shifter is connected as an input to one frequency multiplier of a pair of frequency multipliers and an output from the other phase shifter is connected as an input to the other frequency multiplier of the pair of frequency multipliers, and/or
   an input from one phase shifter is connected as an output to one frequency multiplier of another pair of frequency multipliers and an input from the other phase shifter is connected as an output to the other frequency multiplier of the another pair of frequency multipliers.

4. The transmitter as defined in claim 1, further comprising:
   variable amplifier, an amplifier and/or an attenuator provided in each of the two signal paths which adjusts the amplitude of the output signals in the two signal paths.

5. The transmitter as defined in claim 1, wherein said output signals in the two signal paths have a frequency of approximately 200 GHz or above.

6. The transmitter as defined in claim 1, further comprising: a controller configured to generate the phase control signals and the amplitude control signals.

7. A system comprising:
   the radio transmitter as defined in claim 1; and
   a receiver.

8. The system as defined in claim 7, wherein the receiver comprises a single antenna which receives the output signals transmitted from the radio transmitter and forms the combined signal.

9. The system as define in claim 7, wherein the receiver comprises:
   a pair of two antennas which receive the output signals from the radio transmitter; and
   a signal combiner which combines the output signals received and forms the combined signal.

10. A method of using the transmitter as defined in claim 1 comprising:
    determining the phase control signals and amplitude control signals in the two signal paths with a controller by:
    receiving an output signal value for the combined signal corresponding to vector S, in which $S=|S|\angle\Phi_S$, where $|S|$ is the magnitude of S and $\Phi_S$ is the phase of S; and
    determining two vectors v1 and v2, for the two signal paths, respectively, where $v1=|v1|\angle\phi_1$ and $v_2=|v2|\angle\phi$, whose the vector-sum corresponds to the desired amplitude and phase shift of the output signal value.

11. The method of claim 10, wherein the output signal values are analog signals.

12. The method of claim 10, wherein the output signal values are digital signals.

13. The method of claim 12, wherein the output signal values correspond to the magnitude and phase of a known symbol or point according to a digital modulation scheme.

14. The method of claim 13, wherein the digital modulation scheme is a Quadrature Amplitude Modulation (QAM) scheme.

15. The method of claim 10, wherein it is assumed that $|v1|=|v2|$.

16. The method of claim 10, wherein it is assumed that $|v1|\neq|v2|$.

17. The method of claim 10, wherein the vector S is provided by a user, retrieved as a default value stored in a memory, or determined from a look-up table of known values stored in memory associated with the controller.

18. The transmitter as defined in claim 1, further comprising:
    a radio frequency signal source; and
    a splitter which receives an input signal from said signal source and divides said input signal into two input signals one for each of the two signal paths.

19. The transmitter as defined in claim 18, wherein the antennas are located at the same location.

20. The transmitter as defined in claim 1, further comprising:
    a pair of radio frequency signal sources, each of the pair of signal sources providing an input signal to a respective one of the two signal paths.

21. The transmitter as defined in claim 20, wherein the antennas are located at different locations.

22. A radio transmitter system comprising:
    first and second transmitters provided in two signal paths, each transmitter comprising:
    a radio frequency signal source;

a phase shifter which receives an input signal from said signal source and a phase control signal representative of different components of a modulation signal which shifts the phase of the output signal for that transmitter; and wherein said phase control signals are selected so that a vector-sum of the output signals in the two signal paths, when combined, represents a desired amplitude and a desired phase shift of the combined signal.

* * * * *